United States Patent
Brookhuis et al.

(10) Patent No.: US 9,423,308 B2
(45) Date of Patent: Aug. 23, 2016

(54) SIX-AXIS FORCE-TORQUE SENSOR

(71) Applicants: Robert Anton Brookhuis, Enschede (NL); Theodorus Simon Josef Lammerink, Enschede (NL); Remco John Wiegerink, Enschede (NL)

(72) Inventors: Robert Anton Brookhuis, Enschede (NL); Theodorus Simon Josef Lammerink, Enschede (NL); Remco John Wiegerink, Enschede (NL)

(73) Assignees: UNIVERSITEIT TWENTE, Enschede (NL); STICHTING VOOR DE TECHNISCHE WETENSCHAPPEN, Utrecht (NL)

( * ) Notice: Subject to any disclaimer, the term of this patent is extended or adjusted under 35 U.S.C. 154(b) by 0 days.

(21) Appl. No.: 14/371,632

(22) PCT Filed: Jan. 14, 2013

(86) PCT No.: PCT/NL2013/050017
§ 371 (c)(1),
(2) Date: Jul. 10, 2014

(87) PCT Pub. No.: WO2013/105859
PCT Pub. Date: Jul. 18, 2013

(65) Prior Publication Data
US 2014/0331787 A1  Nov. 13, 2014

Related U.S. Application Data

(60) Provisional application No. 61/585,727, filed on Jan. 12, 2012.

(51) Int. Cl.
*G01D 7/00* (2006.01)
*G01L 1/14* (2006.01)
(Continued)

(52) U.S. Cl.
CPC ............ *G01L 1/148* (2013.01); *G01L 1/142* (2013.01); *G01L 1/144* (2013.01); *G01L 3/02* (2013.01); *G01L 5/165* (2013.01); *G01R 27/2605* (2013.01); *G01P 15/125* (2013.01)

(58) Field of Classification Search
CPC ............ G01P 15/125; G01R 27/2605; G01G 23/363; G01L 1/142; G01L 5/165
USPC .............. 73/780, 862.042, 862.337, 862.626
See application file for complete search history.

(56) References Cited

U.S. PATENT DOCUMENTS 4,585,082 A * 4/1986 Harrington ............. G01G 3/12
177/210 C
6,820,493 B1 * 11/2004 Bonin ...................... G01B 7/22
73/105
(Continued)

FOREIGN PATENT DOCUMENTS

JP   2010/223953 A   10/2010
JP   2011/128096 A   6/2011

OTHER PUBLICATIONS

International Search Report, dated Sep. 19, 2013, from corresponding PCT application.

*Primary Examiner* — Max Noori
(74) *Attorney, Agent, or Firm* — Young & Thompson

(57) ABSTRACT

A sensing device for measuring force and/or torque includes a top part with a top electrode structure, a bottom part with a bottom electrode structure, and a support structure. The support structure includes spring elements for supporting the top part on the bottom part with the top electrode structure parallel to and facing the bottom electrode structure. The spring elements provide a gap between the top and bottom electrode structures and allow displacement of the top part relative to the bottom part in three orthogonal directions two parallel and one perpendicular to the bottom plate, and for rotation of the top part relative to the bottom part around three orthogonal axes, corresponding with the two parallel and one perpendicular directions. The displacement and/or rotation induce a change in distance between and/or overlap area of the top and bottom electrodes and a corresponding change of capacitance.

27 Claims, 11 Drawing Sheets

(51) Int. Cl.
   *G01L 5/16* (2006.01)
   *G01L 3/02* (2006.01)
   *G01R 27/26* (2006.01)
   *G01P 15/125* (2006.01)

(56) References Cited

U.S. PATENT DOCUMENTS

| | | | | |
|---|---|---|---|---|
| 2003/0094914 A1* | 5/2003 | Yanagita | ............. | G02B 6/3512 |
| | | | | 318/560 |
| 2004/0187593 A1* | 9/2004 | Okada | ................. | G01L 5/165 |
| | | | | 73/780 |
| 2004/0221650 A1* | 11/2004 | Lehtonen | .............. | G01P 15/125 |
| | | | | 73/514.32 |
| 2005/0061082 A1* | 3/2005 | Dallenbach | ............. | G01L 1/142 |
| | | | | 73/780 |
| 2007/0058238 A1* | 3/2007 | Mala | ..................... | B81B 3/0062 |
| | | | | 359/291 |
| 2010/0268121 A1* | 10/2010 | Kilborn | .................. | A61B 5/412 |
| | | | | 600/587 |
| 2011/0005338 A1 | 1/2011 | Okada | | |
| 2014/0208849 A1* | 7/2014 | Zhang | .................. | G01P 15/125 |
| | | | | 73/514.32 |

* cited by examiner

SIX-AXIS FORCE-TORQUE SENSOR

FIELD OF THE INVENTION

The present invention relates to a sensing device for measuring force and/or torque. Also, the present invention relates to a sensing circuit comprising the sensing device and to a method for measuring force and/or torque.

BACKGROUND OF THE INVENTION

The power transferred between the human body or a robot and the environment, and the associated work that is performed, are important quantities to be estimated when evaluating and optimizing physical interaction. Miniature sensors are essential for measuring this interaction quantitatively in terms of force and movement at the interface, power transfer, work performed and effective dynamics of both the human body or robot and the environment. A three-axis force sensor is known, but this device is only capable of measuring forces normal to the sensor surface so that in-plane (shear) forces and an out-of-plane moment cannot be measured.

It is an object of the invention to provide a sensor for measuring force and/or torque and a sensing circuit with such a sensor that overcome the disadvantages of the prior art.

SUMMARY OF THE INVENTION

The object of the invention is achieved by a sensing device for measuring force and/or torque comprising a top part with a top electrode structure, a bottom part with a bottom electrode structure, and a support structure; the support structure comprising spring elements for supporting the top part on the bottom part with the top electrode structure parallel to and facing the bottom electrode structure, the spring elements arranged for providing a gap between the top and bottom electrode structures; the spring elements being arranged for allowing displacement of the top part relative to the bottom part in three orthogonal directions two parallel and one perpendicular to the bottom plate, and for rotation of the top part relative to the bottom part around three orthogonal axes, corresponding with said two parallel and one perpendicular directions; the top and bottom electrode structures being located in positions on the top and the bottom part, respectively, and positioned in such a way that a change in distance between and/or a change in overlap area of the top and bottom electrodes and a corresponding change of capacitance are induced by the displacement and/or rotation of the top and bottom electrode structures relative to each other.

Advantageously, the spring elements allow displacement of the top plate relative to the bottom plate in three orthogonal directions two parallel and one perpendicular to the bottom plate, and for rotation of the top plate relative to the bottom plate around three orthogonal axes, corresponding with said two parallel and one perpendicular directions. In this manner, the invention provides a six-axis force-torque sensing device capable of sensing forces in three orthogonal directions and moments around each axis parallel to these three directions.

According to an aspect of the invention there is provided a sensing device as described above, wherein the top and bottom electrode structures comprise one or more electrode pairs, for each of the force components that are measured.

According to an aspect of the invention there is provided a sensing device as described above, wherein at least one electrode structure is arranged in electrode regions around an origin location in the sensing device.

According to an aspect of the invention there is provided a sensing device as described above, wherein the bottom top electrode structure comprises a plurality of bottom electrode regions around a center of the bottom electrode structure.

According to an aspect of the invention there is provided a sensing device as described above, wherein the bottom top electrode structure comprises four bottom electrode regions configured in quadrants.

According to an aspect of the invention there is provided a sensing device as described above, wherein top electrode region comprises a top comb structure at the outer edge of each quadrant, and each bottom electrode region comprises a bottom comb structure at the outer edge of the respective corresponding quadrant.

According to an aspect of the invention there is provided a sensing device as described above, wherein the spring elements comprise at least one pillar.

According to an aspect of the invention there is provided a sensing device as described above, wherein the at least one pillar comprises a hollow cylinder.

According to an aspect of the invention there is provided a sensing device as described above, wherein each pillar is arranged to be both longitudinally deformable and transversely flexible.

According to an aspect of the invention there is provided a sensing device as described above, wherein each pillar provides a mechanical coupling of the top part to the bottom part.

According to an aspect of the invention there is provided a sensing device as described above, wherein the pillars form part of either the top part or the bottom part or both parts and extend above or below the electrode structure in the respective part.

According to an aspect of the invention there is provided a sensing device as described above, wherein the sensing device comprises an enclosing part surrounding one of the top part and the bottom part and being attached to the other of the top part and the bottom part, and one or more additional spring elements is coupled between said enclosing part and said one of the top and the bottom part in order to provide additional support.

According to an aspect of the invention there is provided a sensing device as described above, wherein the one or more additional spring elements comprises a plurality of arbitrary shaped elements, each additional spring element being longitudinally deformable and transversely flexible.

According to an aspect of the invention there is provided a sensing device as described above, wherein the one or more additional spring elements comprise a membrane between said enclosing part and said one of the top and the bottom part, the membrane being longitudinally deformable and transversely flexible.

According to an aspect of the invention there is provided a sensing device as described above, wherein the membrane is corrugated.

According to an aspect of the invention there is provided a sensing device as described above, wherein the top part is a conductor-based plate and the bottom part is a second conductor-based bottom plate.

According to an aspect of the invention there is provided a sensing device as described above, wherein the top part and/or the bottom part is a semiconductor-based plate.

According to an aspect of the invention there is provided a sensing device as described above, wherein the top part is a doped silicon plate.

According to an aspect of the invention there is provided a sensing device as described above, wherein the bottom part is a doped silicon-on-insulator plate.

According to an aspect of the invention there is provided a sensing device as described above, wherein the pillars are silicon based, form part of either the top part or bottom part or both, and couple the top part and the bottom part.

According to an aspect of the invention there is provided a sensing device as described above, wherein the top electrode structure comprises a metal pattern.

According to an aspect of the invention there is provided a sensing device as described above, wherein the bottom electrode structure comprises a metal pattern.

According to an aspect of the invention there is provided a sensing device as described above, wherein the top part and/or the bottom part comprises an insulating support layer supporting the top electrode and the bottom electrode structure, respectively.

According to an aspect of the invention there is provided a sensing device as described above, wherein the enclosing part and the additional spring elements or membrane consist of the same material as said one of the top part and the bottom part.

According to an aspect of the invention there is provided a sensing device as described above, wherein the bottom electrode regions configured around the center of the electrode structure comprise circular segment shaped electrodes, wherein each region comprises an inner segment with first circular segment shaped electrodes and an outer segment with second circular segment shaped electrodes; within each segment the electrodes are interdigitated and connected to separate terminals.

According to an aspect of the invention there is provided a sensing device as described above, wherein the bottom electrode regions configured around the center of the electrode structure comprise elongated substantially straight electrodes running from the center of the electrode structure to a periphery of the electrode structure, wherein each region comprises an inner segment with first elongated electrodes and an outer segment with second elongated electrodes; within each segment the electrodes are interdigitated and connected to separate terminals.

According to an aspect of the invention there is provided a sensing device as described above, wherein the force and/or torque range of the sensing device is adapted by the number of spring elements, and/or a shape and/or a stiffness of the spring elements and/or mechanical properties of the spring element material.

According to an aspect of the invention there is provided a sensing device as described above, wherein the force and/or torque range of the sensing device is further adapted by the mechanical properties of the one or more additional spring elements.

According to an aspect of the invention there is provided a differential capacitance measurement circuit, comprising a differential relaxation oscillator comprising a Modified Martin oscillator, wherein the differential relaxation oscillator is arranged for measuring a differential capacitance between a first capacitor and a second capacitor, and for providing a frequency signal as output, a change of the frequency signal of the oscillator being proportional to the change of capacitance; the first and second capacitor being arranged in a parallel setting with one common node; the common node being connected to an input of the Modified Martin Oscillator.

According to an aspect of the invention there is provided a sensing circuit for measuring force and/or torque comprising the differential capacitance measurement circuit as described above and a sensing device for measuring force and/or torque According to an aspect of the invention there is provided a sensing device as described above, wherein the first capacitor is a first pair of a first top electrode region and its corresponding bottom electrode region of the sensing device and the second capacitor is a second pair of a second top electrode region and its corresponding bottom electrode region of the sensing device, wherein one electrode of the first pair and one electrode of the second pair are electrically connected as the common node to an input node of the Modified Martin oscillator.

According to an aspect of the invention there is provided a sensing circuit for measuring force and/or torque comprising the differential capacitance measurement circuit as described above and a sensing device for measuring force and/or torque as described above, wherein the first capacitor is a first pair of a first top electrode region and its corresponding bottom electrode region, the second capacitor is a second pair of a top electrode region and its corresponding bottom electrode region, wherein one electrode of the first capacitor and one electrode of the second capacitor are electrically connected to each other and to one electrode of a third capacitor comprising a third pair of a top electrode region and its corresponding bottom electrode region, the other electrode of the third capacitor being connected to the input node of the Modified Martin Oscillator.

According to an aspect of the invention there is provided a sensing circuit as described above, further comprising a controlling circuit for supplying a first square wave voltage signal between the terminals of the first capacitor and a second square wave voltage signal between the terminals of the second capacitor, wherein the second square wave voltage signal is 180° phase shifted relative to the first square wave voltage signal.

According to an aspect of the invention there is provided a sensing circuit as described above, further comprising a microcontroller circuit for registering the frequency signal of the differential relaxation oscillator.

According to an aspect of the invention there is provided a sensing circuit as described above, wherein the sensing circuit comprises a switching unit for selecting a first electrode region of the sensing device for the first pair of the first top electrode region and its corresponding bottom electrode region, and a second electrode region of the sensing device for the second pair of the second top electrode region and its corresponding bottom electrode region from the electrode regions.

According to an aspect of the invention there is provided a sensing circuit as described above, further comprising a reference capacitor, the reference capacitor arranged between an output of the controlling circuit and the input node of the Modified Martin oscillator.

According to an aspect of the invention there is provided a sensing circuit as described above, wherein the reference capacitor is arranged on the sensing device.

BRIEF DESCRIPTION OF DRAWINGS

The invention will be explained in more detail below with reference to drawings in which illustrative embodiments of the invention are shown. The drawings are intended for illustration purposes only without limitation of the scope of protection as defined by the subject matter of the appended claims.

DESCRIPTION OF EMBODIMENTS

Figure 1A:
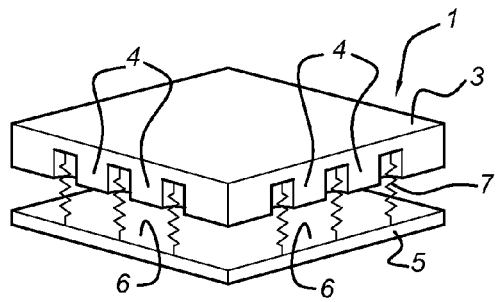
FIGS. 1a-1c show perspective views of a sensing device according to an embodiment of the invention.

According to an embodiment, a force-torque sensing device 1 comprises a top plate 3 with a planar top electrode structure 4, a bottom plate 5 with a planar bottom electrode structure 6, and a support structure 7. The support structure 7 comprises spring elements for supporting the top plate 3 on the bottom plate 5 with the planar top electrode structure 4 parallel to and facing the planar bottom electrode structure 6, see FIG. 1a. The spring elements provide a gap G between the top and bottom electrode structures 4, 6. The bottom electrode structure comprises four bottom electrode regions configured in quadrants Q1, Q2, Q3, Q4 around a center C of the electrode structure.

The spring elements allow displacement of the top plate 3 relative to the bottom plate 5 in three orthogonal directions X, Y, Z, two parallel (X,Y) and one perpendicular (Z) to the bottom plate 5, and for tilt of the top plate relative to the bottom plate around three orthogonal axes, corresponding with said two parallel and one perpendicular directions. In this manner, the force-torque sensing device is a so-called six axis detector capable of detecting forces in three orthogonal directions and moments around each of the axes parallel to these three directions.

In an embodiment, the force-torque sensor comprises a silicon top plate 3 which is supported by thin silicon pillars 7. These pillars are the spring elements of the sensor for all degrees of freedom.

The silicon top plate forms the top electrode of the sensor that is placed on top of a semiconductor bottom plate that forms a bottom electrode.

Under this top plate in the bottom plate, electrodes are created to measure the individual force and torque components using capacitive read-out.

The spring elements arranged between the top plate and the bottom plate provide a gap G between the plates and allow that the top plate is moveable relative to the bottom plate. In this manner the electrodes in the top and bottom plate constitute a variable capacitor structure capable of measuring change in capacitance due to a change of position of the electrodes in the top part relative to the electrodes in the bottom part, i.e. a change in gap distance and/or a change of overlap area.

Figure 1B:
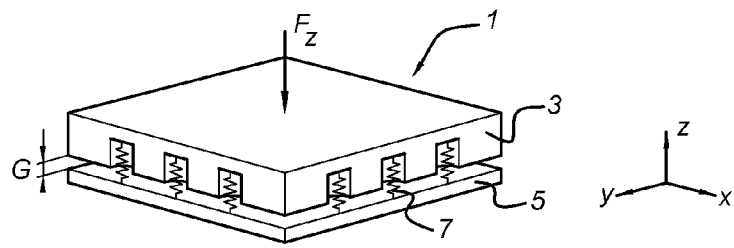

A normal force $F_z$ applied to the top plate will compress the silicon pillars and cause a change in gap proportional to the applied force, resulting in a changing capacitance, as shown in FIG. 1b.

To be able to measure moments $M_x$ and $M_y$, the bottom electrode is divided into regions or area sections. In this exemplary configuration, four regions are used, to divide the bottom electrode into four quadrants each forming a capacitor with the top electrode.

It will be appreciated that within the scope of the invention configurations with an other layout of regions are conceivable.

Also, it will be appreciated that at least one electrode per degree of freedom is required. More electrodes per degree of freedom can increase the measurement sensitivity or improve the measurement accuracy.

Figure 1C:
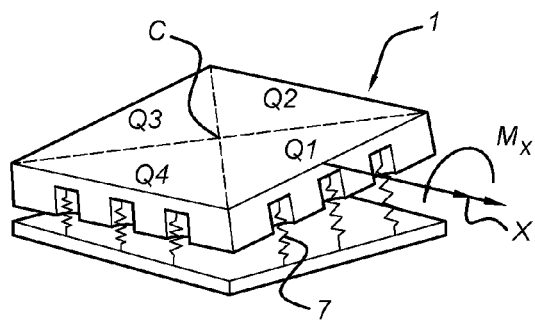

An applied moment $M_x$ will cause a differential change in the gap between two opposite quadrants Q2, Q4 and therefore a differential change in capacitance, also shown in FIG. 1c.

Figure 2A:
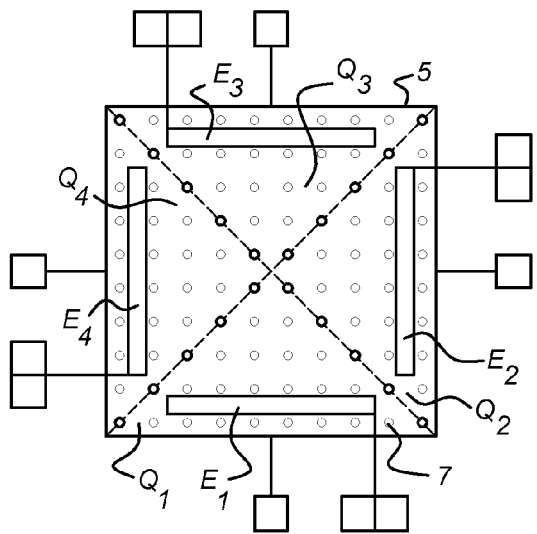
FIG. 2a shows a top view of a bottom plate electrode according to an embodiment.

For the measurement of shear forces $F_x$ and $F_y$ and moment $M_z$, comb-structures E1, E2, E3, E4 are integrated in the top and bottom electrode at the edges of each quadrant Q1, Q2, Q3, Q4, as shown in the plane view of FIG. 2a.

In the embodiment shown in FIG. 2a, pillars 7 are arranged along a two-dimensional lattice over the surface of the top and bottom electrode.

Figure 2B:
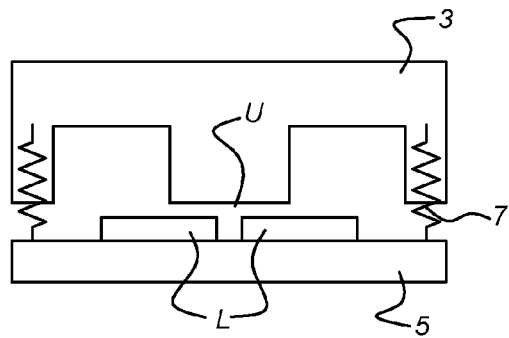
FIGS. 2b, 2c show in a schematic side view the working principle of the sensing device for measuring a shear force.
Figure 2C:
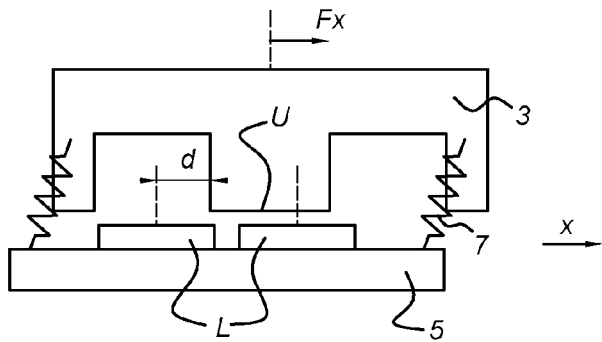

As shown in FIGS. 2b and 2c, a shear force $F_x$ or $F_y$ causes sideways bending of the silicon pillars 7 and results in an in-plane translation d (FIG. 2c). As a result, differential changes in overlapping area occur between the upper and lower comb-structures U, L, resulting in a differential change in capacitance.

A moment $M_z$ causes an in-plane rotation of the silicon top plate and results in sideways bending of the pillars radially around the axis of the applied moment. At the edges of the silicon top plate, the resulting translation causes a differential change in the comb-structures of all quadrants.

The force range and mechanical sensitivity of the sensing device 1 is controlled by the stiffness of the top plate support, which is determined by the number of pillars 7, their length, their diameter and the mechanical properties of the pillars material. The number of pillars ranges from a minimum of one pillar up to the maximum pillars possible for the desired sensor area. The diameter of the pillars can range from e.g. 1 µm to the maximum size allowed by the desired sensor area. The electrical sensitivity can be controlled by the area of the electrodes and the gap distance. In this manner, the force-torque sensing device 1 can be scaled to adapt to a desired force/torque range and/or a desired sensitivity in each direction.

In an embodiment, the one or more pillars comprises a hollow cylinder.

The following section describes a method for manufacturing the sensing device according to an embodiment. It will be appreciated that alternative fabrication methods for the sensor are conceivable.

In the embodiment described here, silicon is chosen as the base material of the sensor, but also other materials such as polymers or ceramics can be used as top part and/or bottom part material.

Figure 3A:
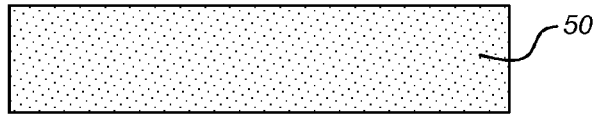
FIGS. 3a-3k and 3m show schematically stages of a fabrication process of a sensing device of the present invention.

The sensor is fabricated using two wafers 50, 51 which are bonded using fusing bonding. The top wafer 50 is a highly doped silicon wafer of 525 μm thickness, in which the silicon pillars are realized (FIG. 3a).

For the bottom wafer 51 a SOI wafer is used with a device layer of 25 μm, insulator thickness of 1 μm and a handle layer thickness of 380 μm, which is one of the possible configurations.

The type and specific dimensions of the top and bottom wafer can be varied depending on the sensor requirements.

Figure 3B:
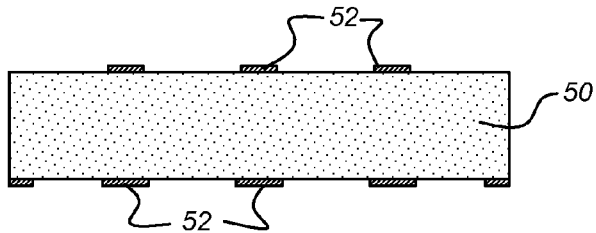
Figure 3C:
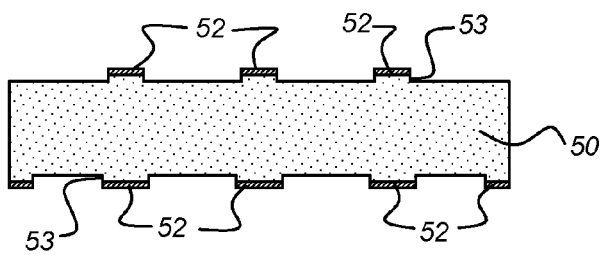

For creating a gap 53 between the electrodes, a slow reactive ion etching method is used with photoresist 52 as mask (FIG. 3b,c). Other methods, among which wet chemical etching can also be used to create the small gap 53. In this embodiment, the top side of wafer 50 is also patterned (FIG. 3c), to ensure that in the fabricated sensing device the load is guided through the silicon pillars to the lower wafer.

Figure 3D:
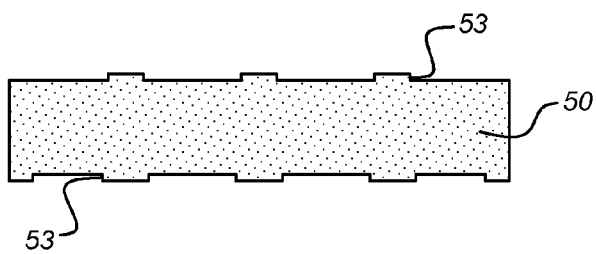

After etching the gap 53, the photoresist mask is removed. (FIG. 3d).

Deep reactive ion etching (DRIE) is one of the possible methods used to create the silicon pillars and to release the force sensitive surface from the wafer.

In this embodiment, the silicon pillars need to be etched at a precisely controlled height and the release etch needs to be etched through the whole wafer.

Figure 3E:
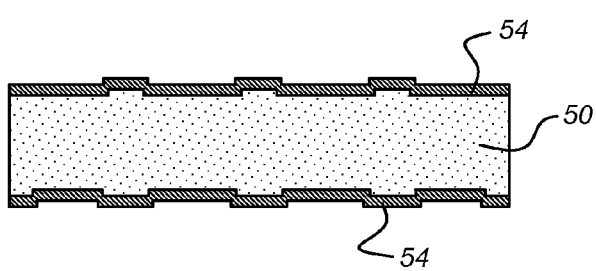
Figure 3F:
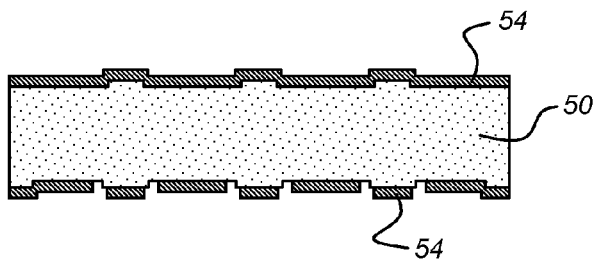

This is realized in a two-step DRIE process using a buried mask. The buried mask is created by depositing and patterning a silicon dioxide layer (TEOS) 54 of 1500 nm (FIG. 3e,f). This layer forms the mask for etching the silicon pillars.

Figure 3G:
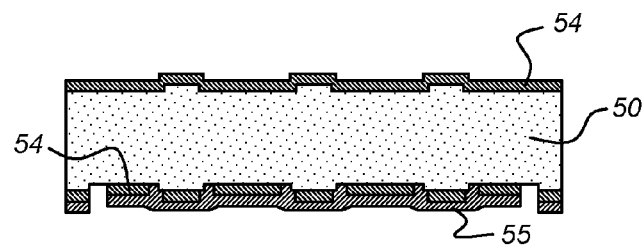

The TEOS layer 54 is covered with a patterned layer 55 of OiR 907-17 photoresist (FIG. 3g), which is used as a mask for releasing the force sensitive surface.

Figure 3H:
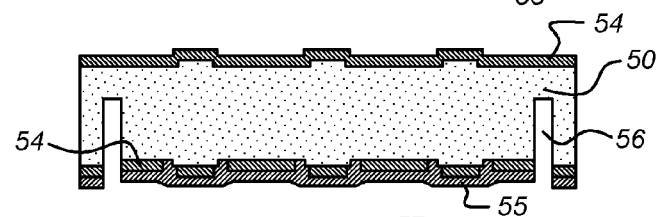

The first DRIE step etches 350 μm deep trenches 56 to form the pre-release (FIG. 3h). After this step, the photoresist layer 55 is removed.

Figure 3I:
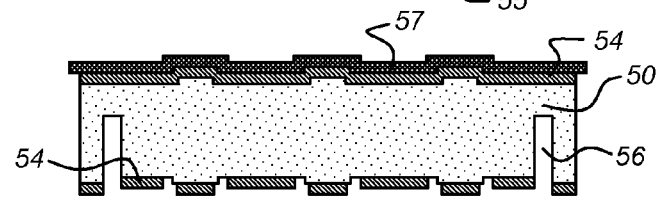

A foil 57 is applied to the topside of the wafer, which is required for wafer-through etching (FIG. 3i). This foil forms an etch stop and prevents leakage of the helium backside cooling and ensures stable temperature control of the wafer during the etching process.

Figure 3J:
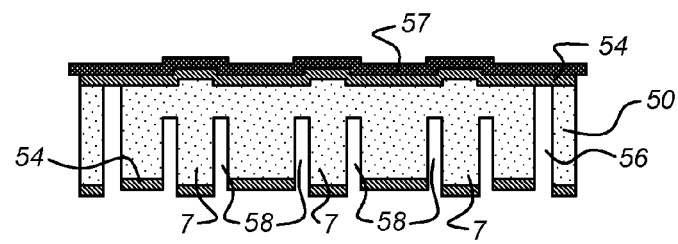
Figure 3K:
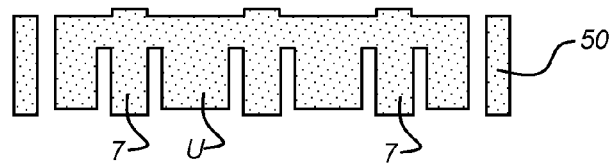

In the second DRIE step, the silicon pillars 7 are created by etching 300 μm deep 58 (FIG. 3j). In this step, the force sensitive surface is released from the top wafer substrate 50 and is only supported by its surrounding suspension. The foil 57 on the topside is removed with reactive $O_2$ plasma (Tepla 300E) and the remaining (TEOS) oxide on the wafer is removed in a 50% HF solution (FIG. 3k).

In the bottom wafer 51, electrodes 59 and bond areas 60 are realized for capacitive read-out. An SOI-wafer is used to create the electrodes (FIG. 3m) and to enable high temperature silicon fusion bonding on the bond pads 60 with the pillars 7.

Fusion bonding is chosen to create a strong mechanical bond between the top and bottom wafer and is performed at 1100° C., which makes the use of metal electrodes inapplicable in this embodiment.

Figure 3M:
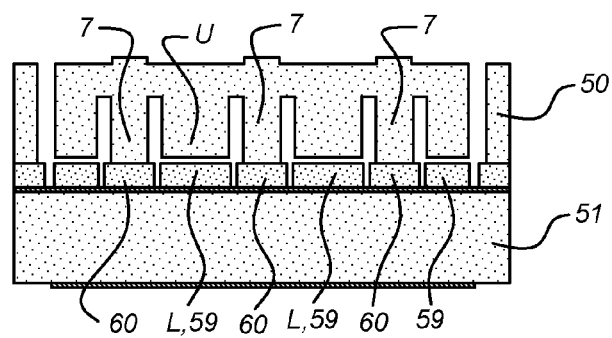

Both wafers undergo a 1% HF dip and are cleaned with fuming nitric acid (100%) and hot nitric acid (69%). Before bonding, the wafers are treated with a Piranha solution ($H_2O_2$:$H_2SO_4$=1:3) for 30 minutes to clean the wafers and to create hydroxyl (OH) groups to initiate wafer bonding. Then, the wafers are aligned using a mask aligner and brought into contact to create a pre-bond. An IR-camera is used to monitor the pre-bond and then the wafers are exposed to 1100° C. in an $N_2$ ambient for 7 hours to create a strong silicon-to-silicon bond (FIG. 3m).

In the method as described above, the electrodes U, L; E1, E2, E3, E4 consist of doped semiconductor material to allow the fusion bonding. It is noted that in alternative embodiments, where other manufacturing techniques are applied, the electrodes of the top and/or bottom part can be formed by a metal pattern on the surface of the top and/or bottom part substrates. To realize this, a bonding technique other than high temperature fusion bonding is required, e.g. eutectic, anodic or adhesive bonding.

Additionally, the sensing device 1 according to the invention may be manufactured from other materials than silicon, e.g. polymers or ceramics.

It is noted that in some embodiments, the material of choice for the top part may be different from the bottom part material. For example, a combination of silicon with a polymer or with glass is conceivable.

As described above with reference with FIG. 1b, a force $F_z$ along the z-axis, i.e. perpendicular to the planar surface of the sensing device 1 is measured by change of the capacitance of the device due to change of the gap distance between top plate electrodes and bottom plate electrodes by the force $F_z$. A moment $M_z$ around the z-axis is measured by the change of capacitance due to a rotation of the top plate electrodes relative to the bottom plate electrodes causing a change in overlap area between top and bottom electrodes. The forces $F_x$, $F_y$ parallel to the planar surface of the sensing device can be measured by change of capacitance by translation of the top plate electrodes relative to the bottom plate electrodes along the x-axis and y-axis respectively. Moments $M_x$, $M_y$ cause a tilt of the top plate relative to the bottom plate around the x-axis and y-axis respectively, with a local change of the gap distance and can be measured accordingly by the corresponding change of capacitance.

Figure 4:
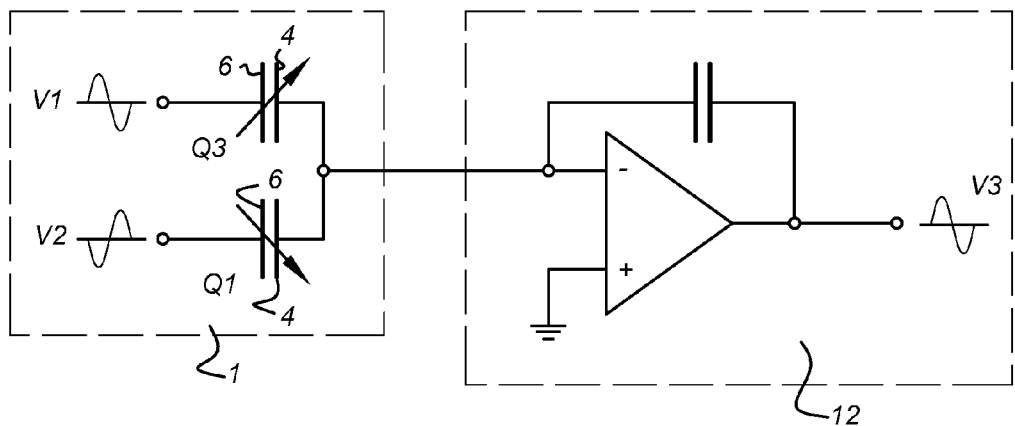
FIG. 4 shows a layout of a sensing circuit comprising the sensing device.

FIG. 4 shows a layout of a sensing circuit 11 comprising the sensing device 1. The top electrode U of the sensor 1 is connected to a charge amplifier 12 (FIG. 4). For measuring moment $M_x$ and $M_y$, two opposite quadrants (e.g. Q1, Q3) are used that are measured in a parallel setting. On each quadrant, alternating (e.g. 1 MHz) voltage signals V1, V2 are applied to the lower electrodes 6 on the respective quadrant with 180° phase-shift with respect to each other. Using a charge amplifier results in an output signal V3 which is proportional to the differential change in capacitance between the two quadrants as caused by the applied force(s) and/or torque(s). Instead of connecting the common node of the differential capacitor directly to the input node of the sensing circuit, the connection may also be a capacitive connection through a coupling capacitor which may or may not be part of the sensing device 1. If the coupling capacitor is part of the sensing device 1 it may or may not be dependent on the measured forces and moments.

For the measurement of the shear force $F_x$ the comb-structure pairs in $Q_2$ and $Q_4$ are used as differential input, for shear force $F_y$ the comb-structure pairs in $Q_1$ and $Q_3$ are used. For the measurement of moment $M_z$ all the comb-structure pairs can be combined.

Figure 5:
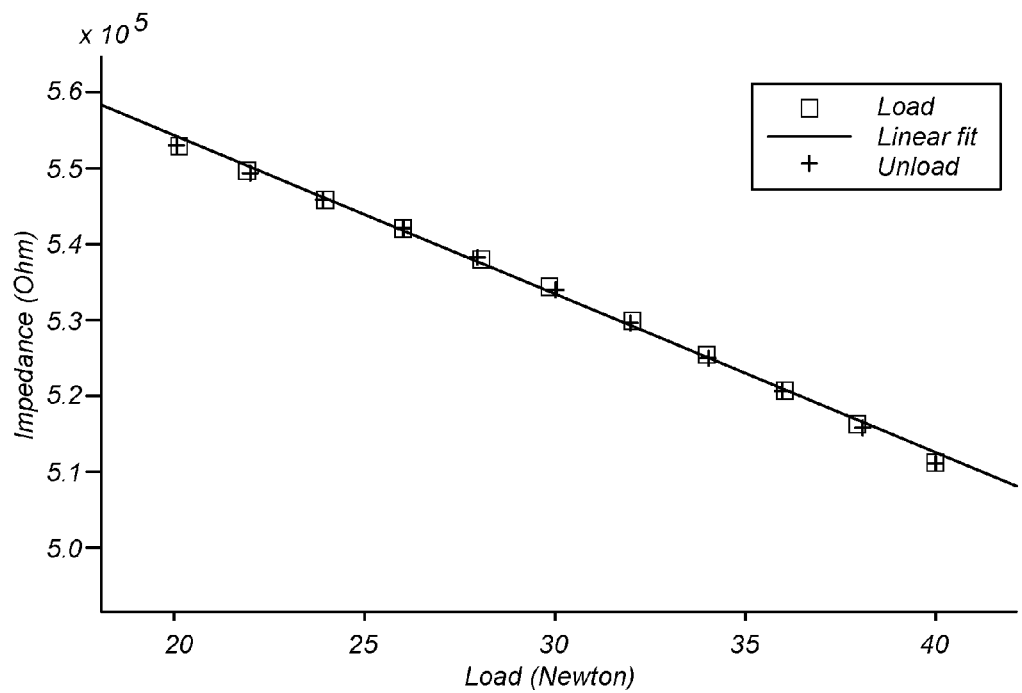
FIGS. 5-8 show results of experiments with an exemplary sensing device according to the invention.

FIG. 5 shows an impedance output of a sensing device 1 according to the invention measured with an impedance analyzer (e.g. HP 4194A) while loading and unloading in one cycle.

Figure 6:
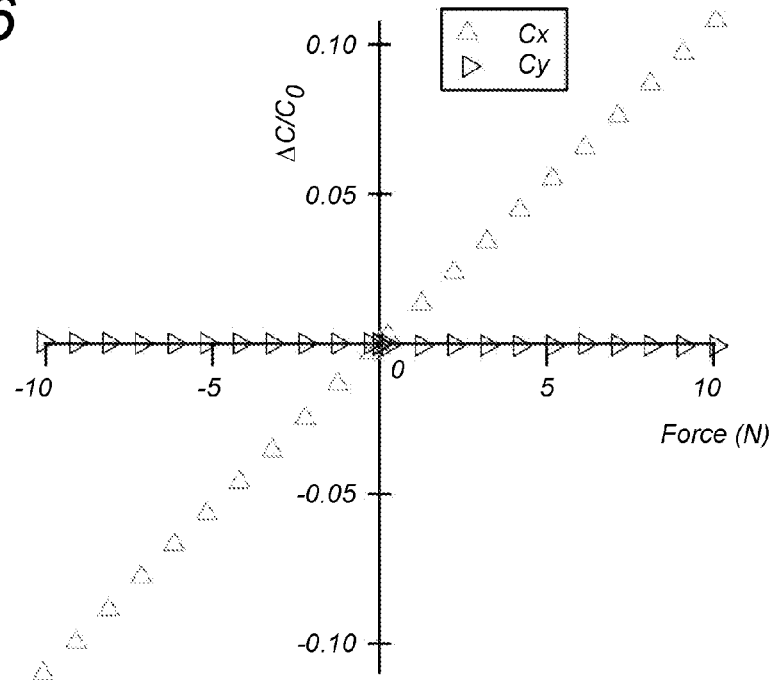

FIG. 6 shows an output of the sensor circuit 12 comprising the sensing device 1 according to the invention when a shear force $F_x$ is applied. The output shows a differential capacitive measurement ΔC/C0 of the comb-structures E2, E4 (Cx) and E1, E3 (Cy).

To measure shear force or torque, the differential charge amplifier 11 is connected to comb-structure pairs in the direction sensitive to force $F_x$ (pairs E2 in $Q_2$ and E4 in $Q_4$). Due to the change in overlapping area in the comb-structure, the change in capacitance is directly proportional with the force $F_x$. The output of the channel orthogonal to the applied force (using pairs E1 in $Q_1$ and E3 in $Q_3$) is also plotted in the graph, showing a very low sensitivity for orthogonal forces.

Figure 7:
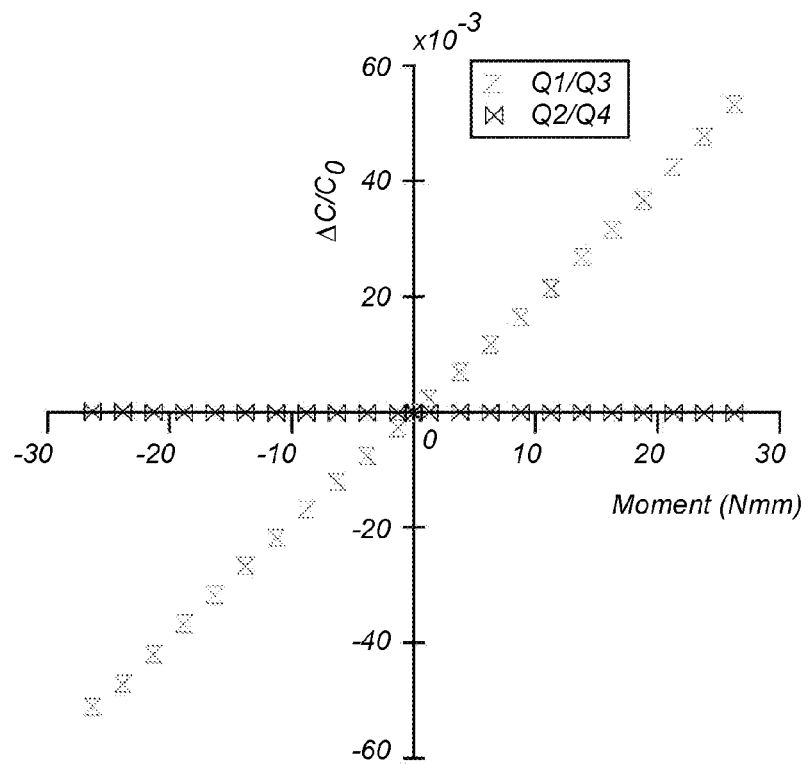

In FIG. 7, the output of the sensor according to the invention upon applying a moment $M_y$ is shown. Two opposite quadrants $Q_1$ and $Q_3$ are connected in parallel to the charge amplifier measuring the differential change in capacitance between $Q_1$ and $Q_3$. An applied moment causes only a small change in angle between the top and bottom electrode. As a result, the differential change in capacitance is for small angle in approximation directly proportional to the applied moment. The output of the differential capacitive measurement of the charge amplifier in the orthogonal channel ($Q_2$ and $Q_4$) shows a very low sensitivity.

Figure 8:
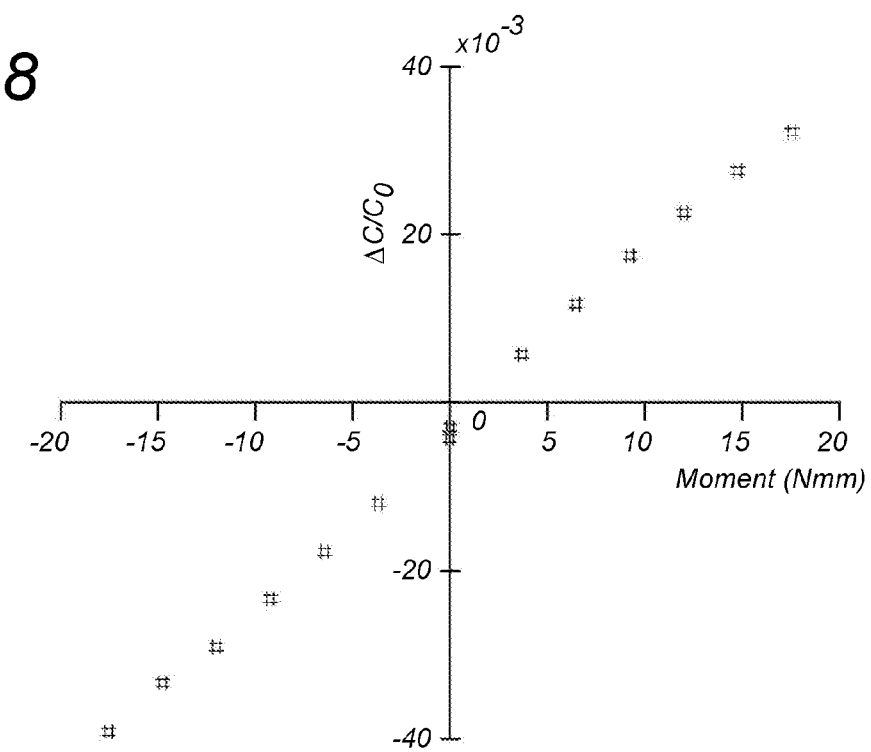

The output of the sensor in response to a moment $M_z$ is shown in FIG. 8. Comb-structure pairs in $Q_1$, $Q_2$, $Q_3$ and $Q_4$ are connected such that a rotation around the z-axis causes a differential change in capacitance. A rotation around the center of the chip (i.e. the center between the comb structures E1, E2, E3 and E4) causes a translation at the edges of the chip where the comb-structures are placed. This results in a linear relation of the change in capacitance with the applied moment.

Table 1 shows the range, full scale error and sensitivity of each individual axis for the sensing device as measured.

TABLE 1

Measured sensor performance

| | Range | % FS$_{error}$ | Sensitivity |
|---|---|---|---|
| $F_z$ | 50N | 0.88% | 0.6 pF/N |
| $F_x$ | 10N | 0.43% | 0.01 pF/N |
| $F_y$ | 10N | 0.43% | 0.01 pF/N |
| $M_z$ | 20N · mm | 2.76% | 0.01 pF/N · mm |
| $M_x$ | 25N · mm | 1.13% | 1.3 pF/N · mm |
| $M_y$ | 25N · mm | 1.13% | 1.3 pF/N · mm |

Thus the present invention provides a design and realization of a six-degree of freedom force-torque sensor.

In the embodiment, the sensor has a wide force range of up to 50 N in normal direction, 10 N in shear direction and 25 N·mm of maximum torque around each axis. By changing the number of pillars between the top plate and the bottom plate, their diameter and their length, the sensor can easily be scaled to adapt for other force/torque ranges and/or other sensitivities in each direction. The obtained accuracy, depending on the sensing axis, ranges from 0.43% of full scale for the shear-force measurement to 2.8% of full scale for $M_z$.

Figure 9A:
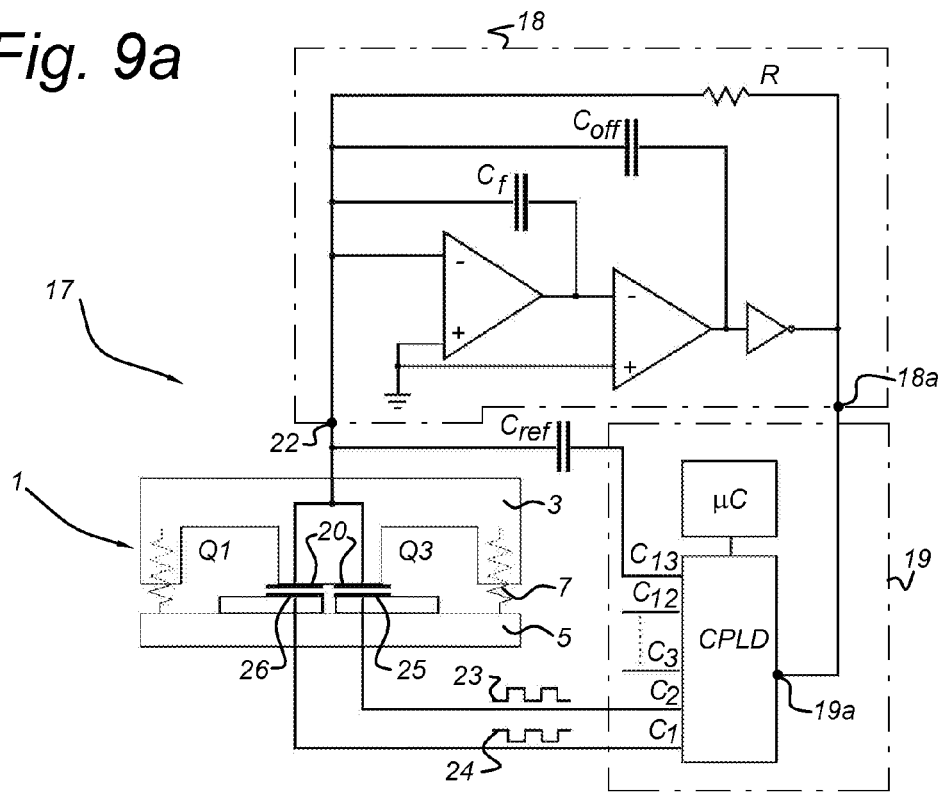
FIGS. 9a and 9b show a layout of a sensing circuit comprising the sensing device in a respective embodiment.

In FIG. 9a, a further embodiment is shown of a sensing circuit 17 that comprises the sensing device 1 as described above and that uses a type of relaxation oscillator 17 based on the per se known Modified Martin oscillator, to measure differential capacitance. The relaxation oscillator 17 comprises the Modified Martin oscillator circuit 18, and a controlling unit 19.

For measuring forces and/or torques two opposite quadrants e.g. Q1, Q3 are used that are measured in a parallel setting. The top electrode 20 of the sensor is connected to an input node 22 of the relaxation oscillator. The input node 22 is also coupled by a reference capacitor Cref to an output of the controlling unit 19. Additionally, the output 18a of the Modified Martin oscillator is coupled to the input 19a of the controlling unit 19.

As shown in FIG. 9a, two square-wave signals 23, 24 with opposite phase are fed to a differential capacitor pair 25, 26 in the sensing device i.e. to electrode structures in different quadrants Q1, Q3. A frequency of the output signal of the relaxation oscillator 17 is dependent on the differential capacitance, resulting in an output which is proportional to the differential change in capacitance between the two quadrants.

Figure 9B:
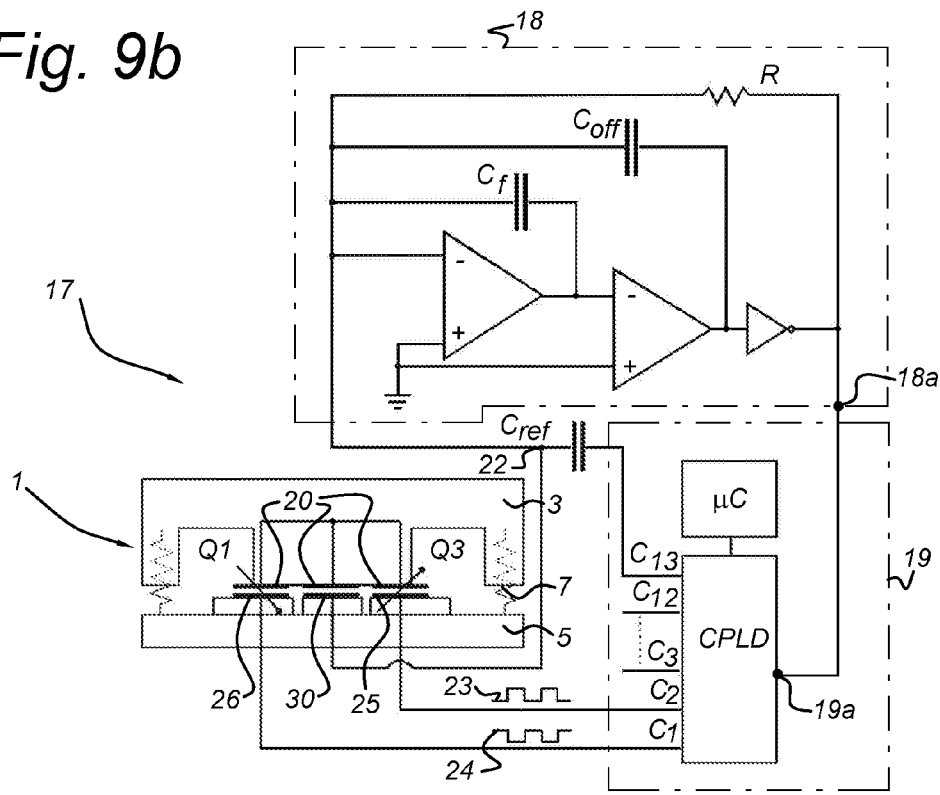

Instead of connecting the common node of the differential capacitor directly to the input node 22 of the relaxation oscillator, the connection may also be a capacitive connection through a third capacitor as shown in FIG. 9b. Here, one electrode of the first capacitor 25 and one electrode of the second capacitor 26 are electrically connected to each other and to one electrode of a third capacitor 30 comprising a third pair of a top electrode region and its corresponding bottom electrode region. The other electrode of the third capacitor is connected to the input node 22 of the Modified Martin Oscillator 18.

Measuring each capacitance only involves switching of logic signals, which is performed by a CPLD (complex programmable logic device) in the controlling unit 19. A microcontroller µC is used to measure the output frequency of the relaxation oscillator 17 for different capacitor configurations and determines the capacitance ratios. Capacitor Cref can be part of the sensing device 1 in order to compensate for e.g. variations in temperature.

Figure 10:
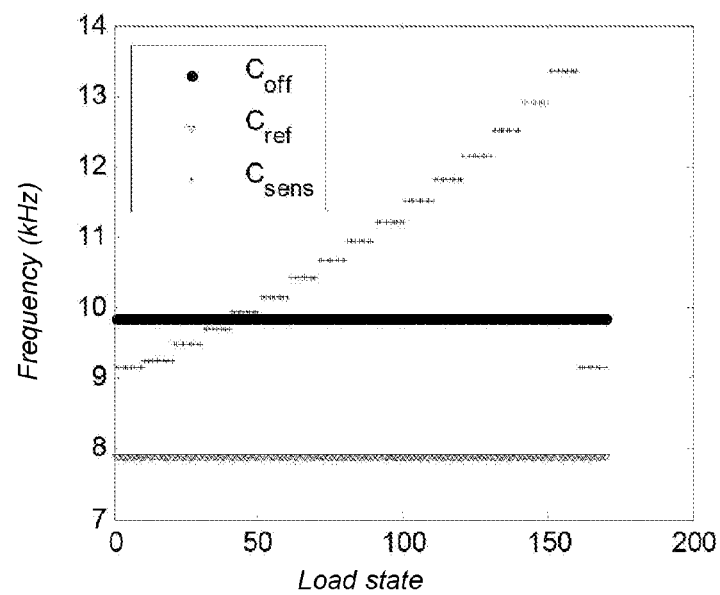
FIGS. 10, 11 show experimental results of an exemplary sensing device according to the invention using the sensing circuit of FIG. 9.
Figure 11:
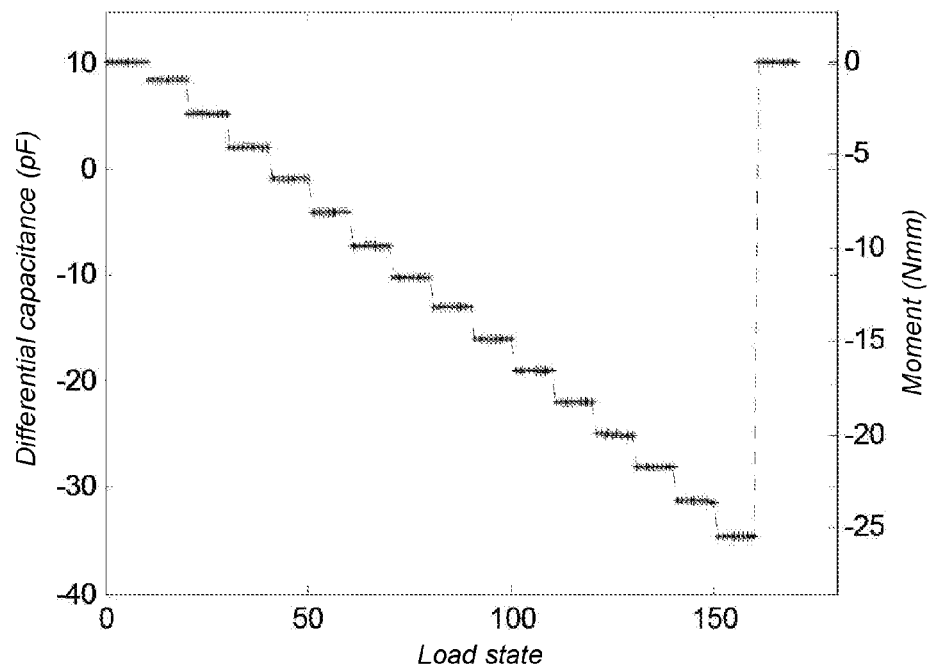

FIGS. 10 and 11 show experimental results of the change in frequency and the measured differential capacitance when a torque of up to 25 N·mm is applied. By sequentially switching capacitors, capacitance ratios are determined with a relatively high stability, in this experiment better than 60 ppm over a temperature range from 20° C. to 50° C.

FIG. 10 shows an output frequency of the oscillator 17 while increasing the moment from 0 N·mm to 25 N·mm. (Csens indicates the frequency of the differential capacitance of two electrode regions in the sensing device 1). Three frequencies are measured to calculate the differential capacitance and to compensate for drift in the oscillator.

FIG. 11 shows a calculated differential capacitance from the frequencies in FIG. 10. The offset as shown is caused by mismatch between the electrodes in the sensor.

Figure 12A:
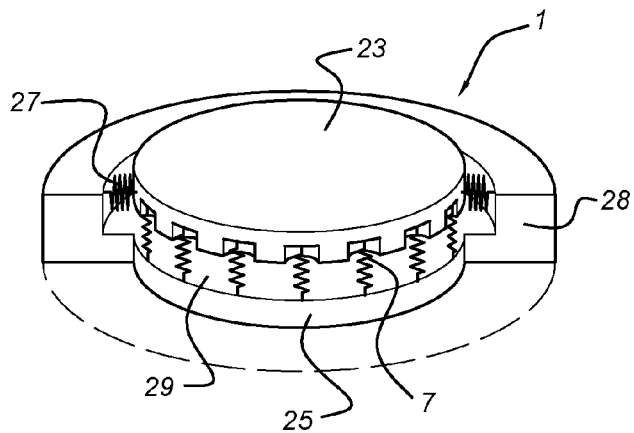
FIGS. 12a-12c show perspective views of a sensing device in accordance with an embodiment of the invention.
Figure 12B:
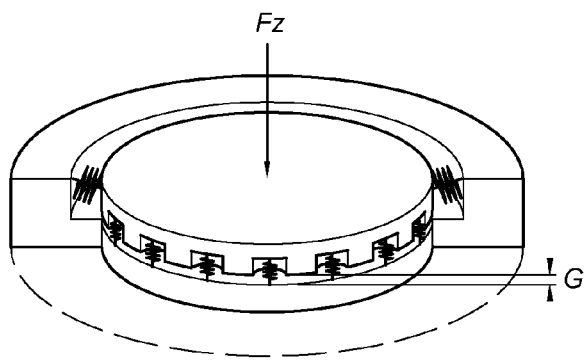
Figure 14:
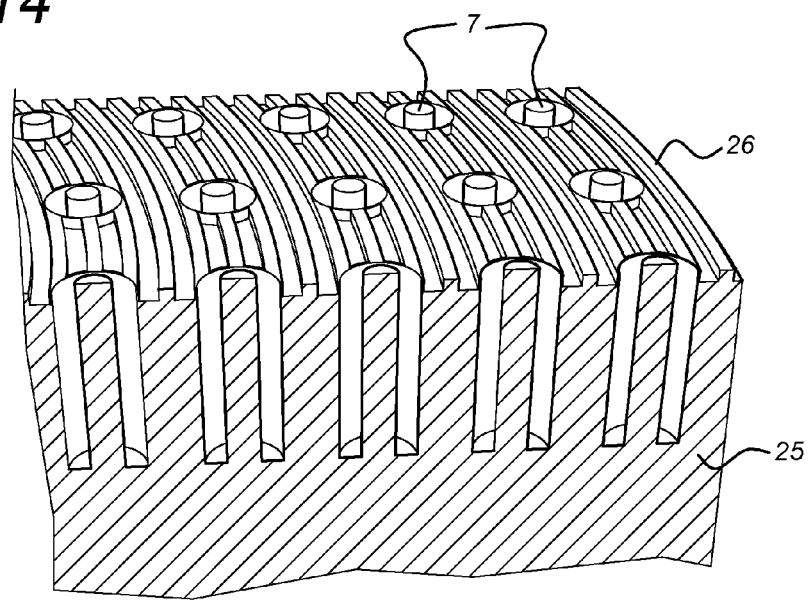
FIG. 14 shows a schematic layout of the structure of the top plate of the sensing device of FIG. 12.

FIG. 12a, 12b shows a sensing device 1 according to an embodiment of the invention. In this embodiment, the sensing device 1 comprises a circular disk shaped top part 23 which is connected to a rigid ring 28 through additional spring elements 27 and supported by more than 300 thin silicon pillars 7. A detailed cross-section of the circular top part 23 is shown in FIG. 14 with top electrode pattern 26.

The enclosing ring 28 is rigidly attached to the bottom plate 25. The additional spring elements 27 between the enclosing ring 28 and the top plate 23 provide additional support of the top part 23. The spring elements 27 may comprise of a nest of springs of arbitrary shape. Additionally or alternatively, the spring elements may be embodied by a longitudinally elastically deformable (compressible and/or stretchable) and flexible membrane extending between the ring 28 and the top part 23. Optionally, this membrane may be corrugated.

Under the disk shaped top part 23 with top electrode pattern 26, circular electrodes are created 29 to measure the individual force components.

Figure 12C:
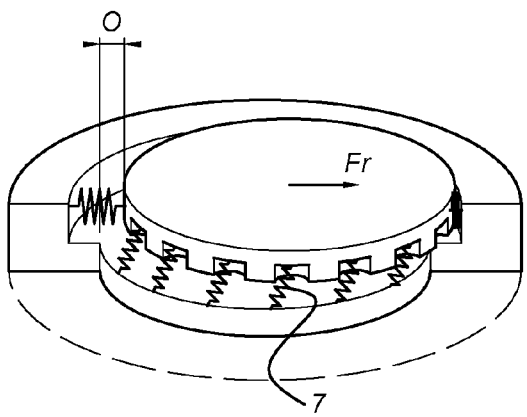
Figure 13:
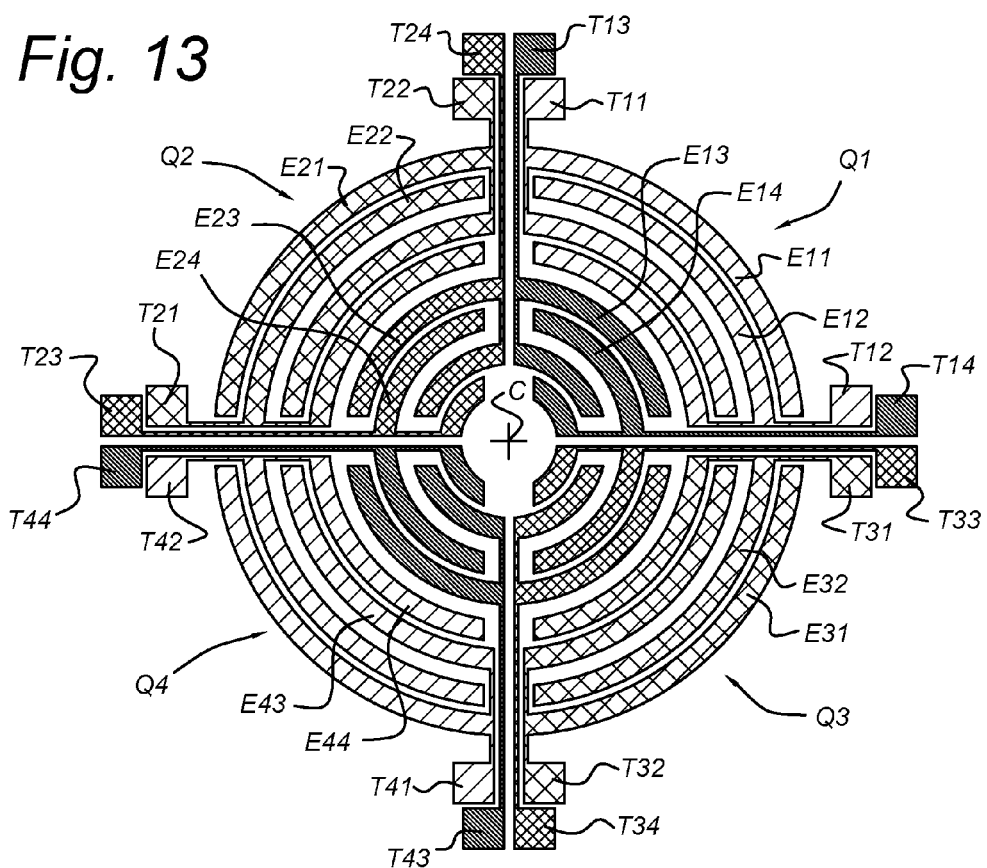
FIG. 13 shows a schematic layout of the electrode structure of the bottom electrode of the sensing device of FIG. 12.

FIG. 13 shows a detailed embodiment of bottom electrode pattern 29. An applied normal force $F_z$ on the disk 23 will compress the silicon pillars resulting in an out-of-plane displacement, as described above. This causes a change in gap G proportional to the applied force (FIG. 12b). An applied shear force Fr will deform the spring elements 27 and bend the silicon pillars sideways, resulting in an in-plane displacement O proportional to the applied force. This causes a differential change in overlapping area between the top and bottom electrodes (FIG. 12c).

As shown in FIG. 13, the displacement of the silicon disk can be measured capacitively using circular electrode pairs that are distributed in circular segments in four quadrants, in each quadrant Q1; Q2; Q3; Q4 the electrode pairs are distributed in an outer segment E11, E12; E21, E22; E31, E32; E41, E42 and an inner segment E13, E14; E23, E24; E33, E34; E43, E44. Within each segment the electrodes are interdigitated and of every pair of electrodes one electrode is connected to a first terminal T11, T13; T21, T23; T31, T33; T41, T43 and the other electrode is connected to a second terminal T12, T14; T22, T24; T32, T34; T42, T44.

In an example, a total of 96 concentric rings are divided in 8 segments (i.e. 4 quadrants, each quadrant having an inner segment and an outer segment) to measure shear force and normal force distribution.

Figure 15:
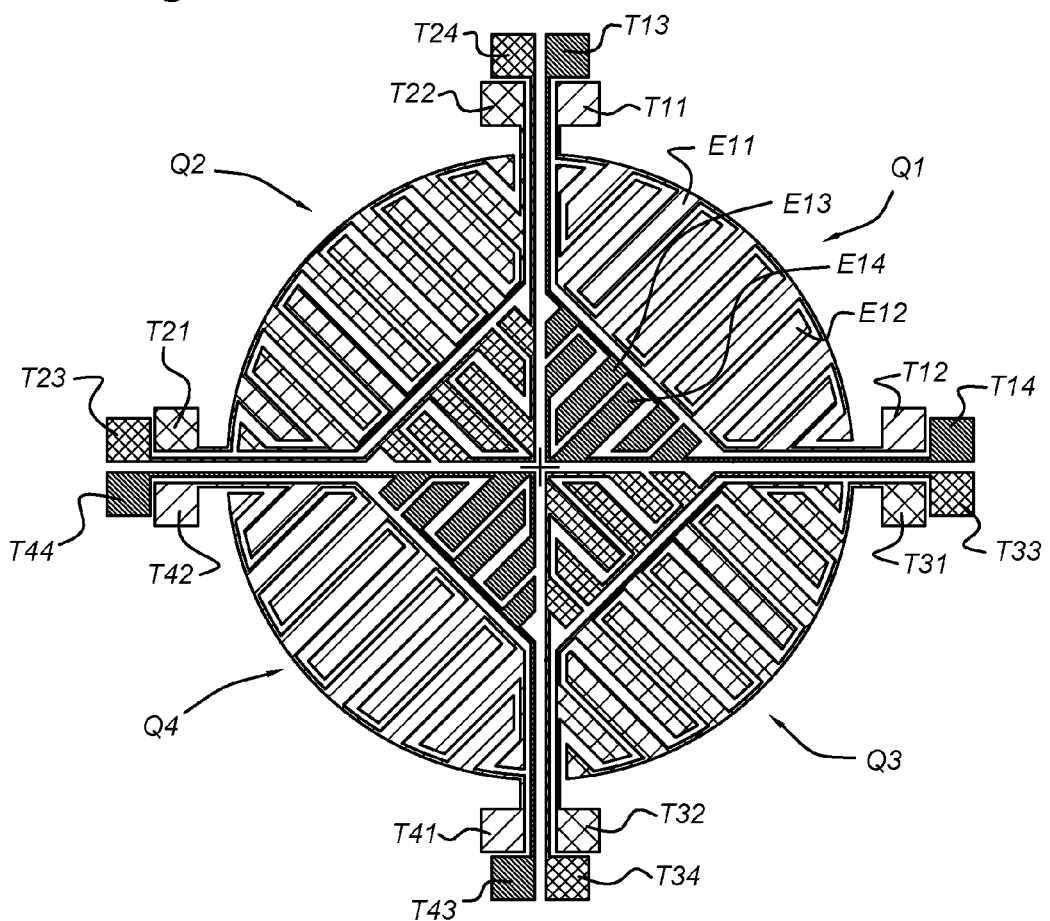
FIG. 15 schematically shows an embodiment of a top electrode configuration.

In an alternative embodiment as shown in FIG. 15 with a corresponding top electrode configuration, the electrode pairs can be straight, within each pair parallel to each other and oriented under 45° with the quadrant borders, while the electrode pairs are still arranged in inner and outer segments in each quadrant. This arrangement of the electrode pairs allows measurement of a moment $M_z$ around the z-axis perpendicular to the plane of the electrode structures.

In embodiments with a plurality of electrode regions, the straight electrodes are oriented parallel to the bisector between the electrode region borders.

The sensor may be fabricated using deep reactive ion etching to realize the corrugated silicon membrane forming the spring elements 27 and the silicon pillars 7 in the top part.

In an embodiment a method similar as the method explained with reference to FIGS. 3a-3m can be applied. An SOI wafer is used to create the bottom electrodes and to enable high temperature fusion bonding which ensures a strong mechanical bond.

The gap between the top and bottom electrode is created using etching or local oxidation of silicon.

After fabrication, the sensor is pushed out of the wafer, eliminating the need for dicing and allowing an arbitrary shape of the sensor chip. The sensor is typically mounted on a PCB complete with capacitive read-out electronics, consisting of the relaxation oscillator as described above with an output frequency proportional to differential capacitance.

The invention claimed is:

1. A sensing device for measuring force and/or torque, comprising:
a top part with a top electrode structure;
a bottom part with a bottom electrode structure; and
a support structure comprising spring elements for supporting the top part on the bottom part with the top electrode structure parallel to and facing the bottom electrode structure, the spring elements being configured to provide a gap between the top and bottom electrode structures,
the spring elements being configured to allow displacement of the top part relative to the bottom part in three orthogonal directions—two parallel and one perpendicular—to the bottom part, and for rotation of the top part relative to the bottom part around three orthogonal axes, corresponding with said two parallel and one perpendicular directions,
the top and bottom electrode structures being disposed in positions on the top and the bottom part, respectively, and positioned such that a change in distance between and/or a change in overlap area of the top and bottom electrodes and a corresponding change of capacitance are induced by the displacement and/or rotation of the top and bottom electrode structures relative to each other,
wherein the top and bottom electrode structures comprise, for each of the three orthogonal directions, one or more pairs of top and bottom plate electrodes, with the plate electrodes in the top and bottom parts constituting a variable capacitor structure configured to measure change in capacitance due to a change of position of the electrode in the top part relative to the electrode in the bottom part, the change in position being one or more of a change in a gap distance and a change of the overlap area.

2. The sensing device according to claim 1, wherein the force and/or torque range of the sensing device is adapted by the number of spring elements, and/or a shape and/or a stiffness of the spring elements and/or mechanical properties of the spring element material.

3. The sensing device according to claim 1, wherein at least one electrode structure is arranged in electrode regions around an origin location in the sensing device.

4. The sensing device according to claim 1, wherein the bottom top electrode structure comprises a plurality of bottom electrode regions around a center of the bottom electrode structure.

5. The sensing device according to claim 4, wherein the bottom top electrode structure comprises four bottom electrode regions configured in quadrants.

6. The sensing device according to claim 4, wherein top electrode region comprises a top comb structure at the outer edge of each quadrant, and
each bottom electrode region comprises a bottom comb structure at the outer edge of the respective corresponding quadrant.

7. The sensing device according to claim 1, wherein the spring elements comprise at least one pillar.

8. The sensing device according to claim 7, wherein the at least one pillar comprises a hollow cylinder.

9. The sensing device according to claim 7, wherein each pillar is arranged to be both longitudinally deformable and transversely flexible.

10. The sensing device according to claim 7, wherein each pillar provides a mechanical coupling of the top part to the bottom part.

11. The sensing device according to claim 7, wherein the pillars form part of either the top part or the bottom part or both parts and extend above or below the electrode structure in the respective part.

12. The sensing device according to claim 1 wherein the sensing device comprises an enclosing part surrounding one of the top part and the bottom part and being attached to the other of the top part and the bottom part,
and one or more additional spring elements is coupled between said enclosing part and said one of the top and the bottom part in order to provide additional support.

13. The sensing device according to claim 12, wherein the one or more additional spring elements comprises a plurality of arbitrary shaped elements, each additional spring element being longitudinally deformable and transversely flexible.

14. The sensing device according to claim 12, wherein the one or more additional spring elements comprise a membrane between said enclosing part and said one of the top and the bottom part, the membrane being longitudinally deformable and transversely flexible.

15. The sensing device according to claim 14, wherein the membrane is corrugated.

16. The sensing device according to claim 1, wherein the top part is a conductor-based plate and the bottom part is a second conductor-based bottom plate.

17. The sensing device according to claim 16, wherein the top part and/or the bottom part is a semiconductor-based plate.

18. The sensing device according to claim 17, wherein the top part is a doped silicon plate.

19. The sensing device according to claim 17, wherein the bottom part is a doped silicon-on-insulator plate.

20. The sensing device according to claim 19, wherein the top part is a doped silicon plate, the pillars are silicon based, form part of either the top part or bottom part or both, and couple the top part and the bottom part.

21. The sensing device according to claim 16, wherein the top electrode structure comprises a metal pattern.

22. The sensing device according to claim 16, wherein the bottom electrode structure comprises a metal pattern.

23. The sensing device according to claim 21, wherein the top part and/or the bottom part comprises an insulating support layer supporting the top electrode and the bottom electrode structure, respectively.

24. The sensing device according to claim 14, wherein the enclosing part and the additional spring elements or membrane consist of the same material as said one of the top part and the bottom part.

25. The sensing device according to claim 1, wherein the bottom electrode regions configured around the center of the electrode structure comprise circular segment shaped electrodes, each region comprises an inner segment with first circular segment shaped electrodes and an outer segment with second circular segment shaped electrodes, and within each segment, the electrodes are interdigitated and connected to separate terminals.

26. The sensing device according to claim 1, wherein the bottom electrode regions configured around the center of the electrode structure comprise elongated substantially straight electrodes running from the center of the electrode structure to a periphery of the electrode structure, wherein each region comprises an inner segment with first elongated electrodes and an outer segment with second elongated electrodes;

within each segment the electrodes are interdigitated and connected to separate terminals.

27. The sensing device according to claim 2, wherein the sensing device comprises an enclosing part surrounding one of the top part and the bottom part and being attached to the other of the top part and the bottom part, and one or more additional spring elements is coupled between said enclosing part and said one of the top and the bottom part in order to provide additional support, and the force and/or torque range of the sensing device is further adapted by the mechanical properties of the one or more additional spring elements.

* * * * *